US011457311B1

(12) United States Patent
Carbo

(10) Patent No.: US 11,457,311 B1
(45) Date of Patent: Sep. 27, 2022

(54) SYSTEM AND METHOD FOR DETERMINING VOICE COIL OFFSET OR TEMPERATURE

(71) Applicant: Bose Corporation, Framingham, MA (US)

(72) Inventor: Randy Michael Carbo, Hopedale, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 17/354,590

(22) Filed: Jun. 22, 2021

(51) Int. Cl.
*H04R 3/00* (2006.01)
*H04R 29/00* (2006.01)
*H03G 3/30* (2006.01)
*H04R 9/06* (2006.01)

(52) U.S. Cl.
CPC ........... *H04R 3/007* (2013.01); *H03G 3/3005* (2013.01); *H04R 9/06* (2013.01); *H04R 29/003* (2013.01); *H03G 2201/103* (2013.01); *H04R 2499/13* (2013.01)

(58) Field of Classification Search
CPC ........ H04R 3/007; H04R 9/06; H04R 29/003; H04R 2499/13; H03G 3/3005; H03G 2201/103
USPC ....... 381/55, 59, 96, 111, 116, 117, 400–412
See application file for complete search history.

(56) References Cited

U.S. PATENT DOCUMENTS

| 7,961,892 | B2 * | 6/2011 | Fedigan | H04R 9/063 381/59 |
| 9,049,523 | B2 | 6/2015 | Bose et al. | |
| 9,729,986 | B2 * | 8/2017 | Crawley | H04R 29/001 |
| 10,110,995 | B2 * | 10/2018 | Klippel | H04R 3/08 |
| 10,129,642 | B2 | 11/2018 | Vinayak | |
| 2003/0072462 | A1 * | 4/2003 | Hlibowicki | H04R 3/007 381/96 |
| 2005/0031139 | A1 * | 2/2005 | Browning | H04R 3/002 381/59 |
| 2016/0050497 | A1 * | 2/2016 | Daubigny | H04R 3/02 381/120 |

* cited by examiner

*Primary Examiner* — Xu Mei
(74) *Attorney, Agent, or Firm* — Bond, Schoeneck & King, PLLC

(57) ABSTRACT

A method for determining a displacement offset of a voice coil of a speaker, comprising: providing a drive signal comprised of a program content signal and a test signal to the voice coil of the speaker; determining at least one value representative of an impedance of the voice coil according to a voice coil voltage and a voice coil current, wherein the voice coil voltage and the voice coil current result from, at least, the test signal; determining whether the at least one value indicates that an offset displacement of the voice coil exceeds a predetermined offset distance; and reducing a magnitude of the drive signal provided to the voice coil if the at least one value indicates that the offset displacement of the voice coil exceeds the predetermined offset threshold.

20 Claims, 12 Drawing Sheets

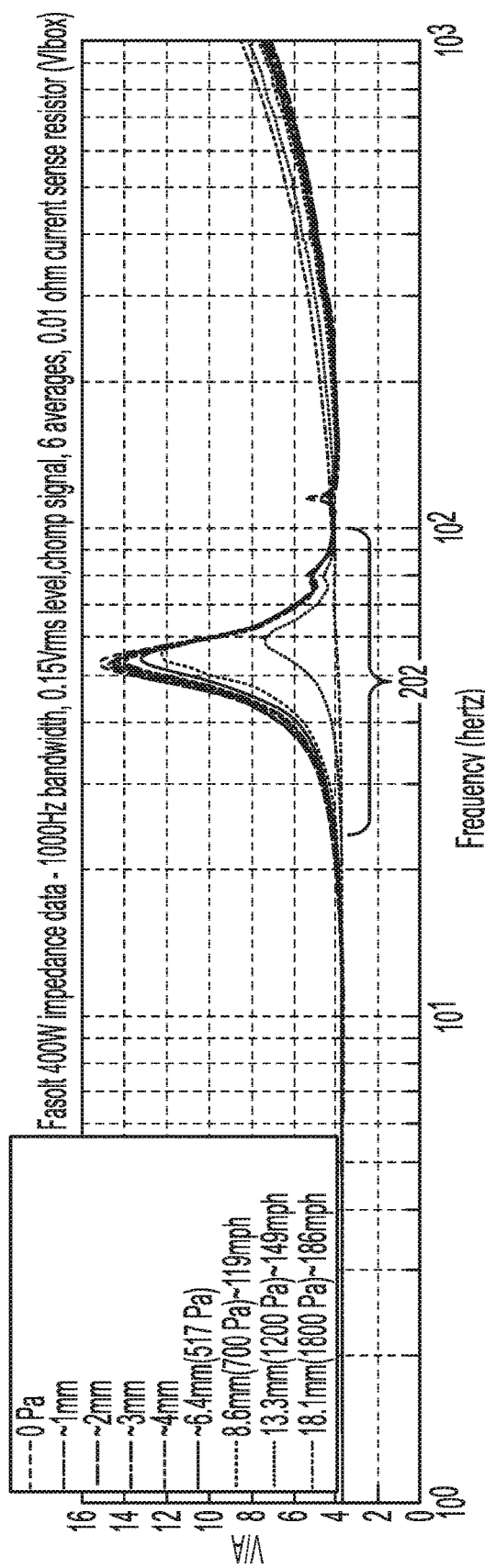
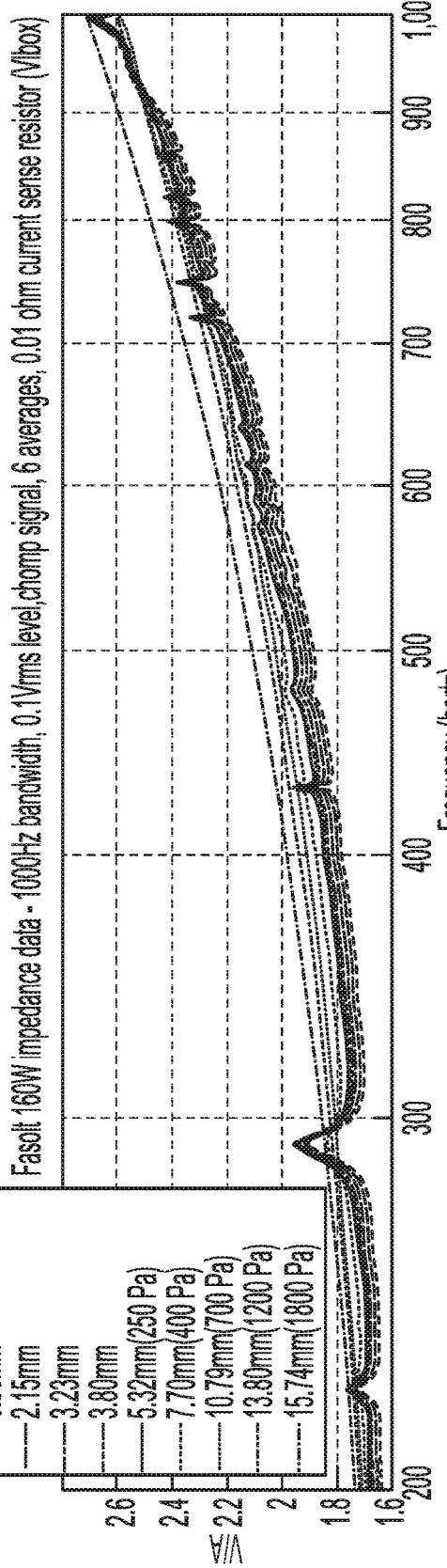
FIG. 2A
FIG. 2B

SYSTEM AND METHOD FOR DETERMINING VOICE COIL OFFSET OR TEMPERATURE

BACKGROUND

The present disclosure generally relates to systems and methods for determining the voice coil offset or temperature.

SUMMARY

All examples and features mentioned below can be combined in any technically possible way.

According to an aspect, a method for determining a displacement offset of a voice coil of a speaker, includes: providing a drive signal comprised of a program content signal and a test signal to the voice coil of the speaker; determining at least one value representative of a relationship between a voice coil voltage and a voice coil current, wherein the voice coil voltage and the voice coil current result from, at least, the test signal; determining whether the at least one value indicates that an offset displacement of the voice coil exceeds a predetermined offset distance; and reducing a magnitude of the drive signal provided to the voice coil if the at least one value indicates that the offset displacement of the voice coil exceeds the predetermined offset distance.

In an example, the at least one value is a plurality of coefficients of a polynomial that relates the voice coil voltage and the voice coil current.

In an example, the plurality of coefficients are determined according to an adaptive filter.

In an example, the at least one value indicates that the offset displacement of the voice coil exceeds the predetermined offset distance if, at least, one of the plurality of coefficients exceeds a coefficient threshold.

In an example, the at least one value is a ratio of the voice coil voltage and the voice coil current.

In an example, the at least one value is a magnitude and phase of an impedance of the voice coil.

In an example, the magnitude and phase are determined with a phase-lock loop.

In an example, the magnitude and phase are determined with a lock-in amplifier.

In an example, wherein a magnitude of the test signal is related to a magnitude or to an average magnitude of at least one program content signal provided to the voice coil.

In an example, the method further includes the steps of determining whether the at least one value indicates that a temperature of the voice coil has exceeded a predetermined temperature threshold; and reducing a magnitude of a drive signal provided to the voice coil if the at least one value indicates that the temperature of the voice has exceeded the predetermined temperature threshold.

According to another aspect, a non-transitory storage medium storing program code that, when executed by a processor, performs a method including the steps of: determining at least one value representative of a relationship between a voice coil voltage and a voice coil current, wherein the voice coil voltage and the voice coil current result from, at least, a test signal applied to a voice coil of a speaker; determining whether the at least one value indicates that an offset displacement of the voice coil exceeds a predetermined offset distance; and reducing a magnitude of a drive signal provided to the voice coil if the at least one value indicates that the offset displacement of the voice coil exceeds the predetermined offset distance, wherein the drive signal includes the test signal.

In an example, the at least one value is a plurality of coefficients of a polynomial that relates the voice coil voltage and the voice coil current.

In an example, the plurality of coefficients are determined according to an adaptive filter.

In an example, the at least one value indicates that the offset displacement of the voice coil exceeds the predetermined offset distance if, at least, one of the plurality of coefficients exceeds a coefficient threshold.

In an example, the at least one value is a ratio of the voice coil voltage and the voice coil current.

In an example, the at least one value is a magnitude and phase of an impedance of the voice coil.

In an example, the magnitude and phase are determined with a phase-lock loop.

In an example, the magnitude and phase are determined with a lock-in amplifier.

In an example, wherein a magnitude of the test signal is related to a magnitude or to an average magnitude of at least one program content signal provided to the voice coil.

In an example, the method further includes the steps of determining whether the at least one value indicates that a temperature of the voice coil has exceeded a predetermined temperature threshold; and reducing a magnitude of a drive signal provided to the voice coil if the at least one value indicates that the temperature of the voice has exceeded the predetermined temperature threshold.

According to yet another aspect, a method for determining a displacement offset of a voice coil of a speaker, including: providing a drive signal comprised of a program content signal and a test signal to the voice coil of the speaker; determining at least one value representative of a relationship between a voice coil voltage and a voice coil current, wherein the voice coil voltage and the voice coil current result from, at least, the test signal; determining whether the at least one value indicates that a temperature of the voice coil has exceeded a predetermined temperature threshold; and reducing a magnitude of a drive signal provided to the voice coil if the at least one value indicates that the temperature of the voice has exceeded the predetermined temperature threshold.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various aspects.

FIG. 2A depicts a plot of the impedance of voice coils of various diameters and at various pressures, across frequency, according to an example.

FIG. 2B depicts a plot of the impedance of voice coils of various diameters and at various pressures, across frequency, according to an example.

DETAILED DESCRIPTION

A vehicle that is operated at high speeds and with the windows down can create high pressure in the vehicle cabin. The high pressure can force the voice coil of a speaker, disposed within the cabin, toward the rear of the speaker. Operating the speaker when the voice coil is in this position can potentially damage the speaker. Accordingly, there exists a need in the art for identifying when voice coil is positioned in manner that operating the speaker could result in damage to the speaker and for taking preventative measures to avoid such damage.

Figure 1A:
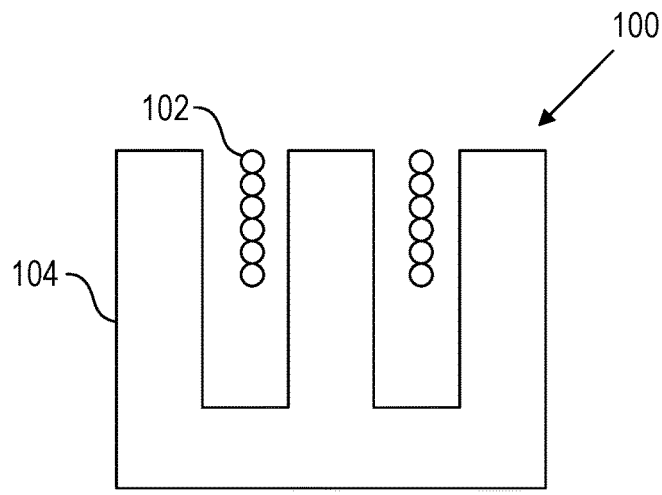
FIG. 1A depicts a cross-section view of a voice coil and magnet structure of a speaker, according to an example.
Figure 1B:
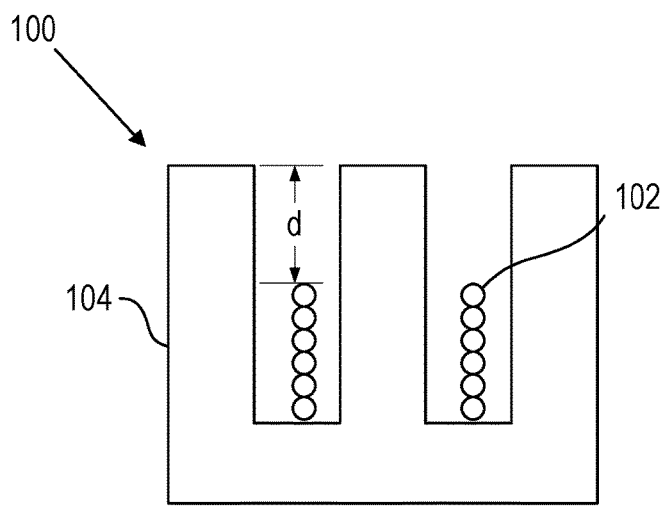
FIG. 1B depicts a cross-section view of a voice coil and magnet structure of a speaker, according to an example.

A simplified cross-section schematic of a voice coil 102 and magnet structure 104 of a speaker 100 are shown in FIGS. 1A and 1B (other structure of speaker 100, such as the chassis, cone, surround, etc., have been omitted for clarity). During normal operation of speaker 100, voice coil 102 receives a time-varying signal, which induces a magnetic field. The interaction between the magnetic field of voice coil 102 and the magnetic field of the magnetic structure 104 causes the voice coil to move. The displacement of the voice coil 102 moves diaphragm of speaker 100, to which it is connected, which, in turn, pushes the ambient air to generate sound waves.

As mentioned above, the pressure within the cabin of a vehicle traveling at high speeds can force the voice coil toward the rear of the speaker. This is demonstrated in FIG. 1B, which shows that the voice coil 102 has traveled distance d as a result of the pressure within the cabin. The distance d traveled by the voice coil as a result of pressure within the cabin is referred to in this disclosure as offset or offset displacement. It will be understood that the offset does not refer to the instantaneous location of the voice coil, but rather to its average location—i.e., the location about which the voice coil oscillates when transducing a time-varying input signal.

In addition, during use, the voice coil of the speaker can overheat when playing loud, especially distorted, music. Accordingly, there exists a need in the art for identifying when the voice coil of a speaker is overheating and for taking preventative measures to avoid damaging the speaker.

FIGS. 2A and 2B depict the impedance across frequency of speakers of various diameters and various pressures within a vehicle cabin. As shown, speakers tend to include a resistive component and a large inductive component, denoted in FIG. 2A as 202. Further, as shown in FIGS. 2A and 2B the impedance tends to increase as the pressure on the speaker increases. Stated differently, the impedance tends to increase with the offset of the voice coil. Likewise, the impedances of the voice coil tends to increase with temperature.

More specifically, aspects and examples herein recognize that each of the resistive component (Re) of the voice coil and the inductive component (Le) of the voice coil may change with offset and temperature. In particular, the inductive component (Le) of the voice coil may change based upon offset and the resistive component (Re) of the voice coil may change with temperature, each of which alters the relationship of voltage to current in the voice coil. Accordingly, a change in the relationship between voltage and current in the voice coil may be detected, and determined to be, indicative of a change in offset displacement and/or temperature according to various examples herein.

As will be understood by a person of ordinary skill in the art, impedance is a complex ratio of a voltage to a current. While certain examples treat the impedance as a linear relationship between voltage and current, it should be understood that the relationship is not necessarily linear. Indeed, as demonstrated by FIGS. 2A and 2B, the acoustic transducer is recognized as being a non-linear system. For instance, the magnetic field is not constant across all positions of the moving coil, and mechanical resistance of the suspension (e.g., surround, spider, etc.) is not linearly related to the offset, especially at offsets that approach the limits of the mechanical movement, e.g., as illustrated in FIGS. 1A and 1B. Thus, impedance can be understood as being the ratio of voltage to current at any given time and having both a magnitude and phase or a resistive and a reactive part, but not necessarily as being linearly related. The aspects and examples described herein are applicable to complex non-linear systems, even though one or more examples may appear to treat impedance as a simple linear relationship.

Figure 3:
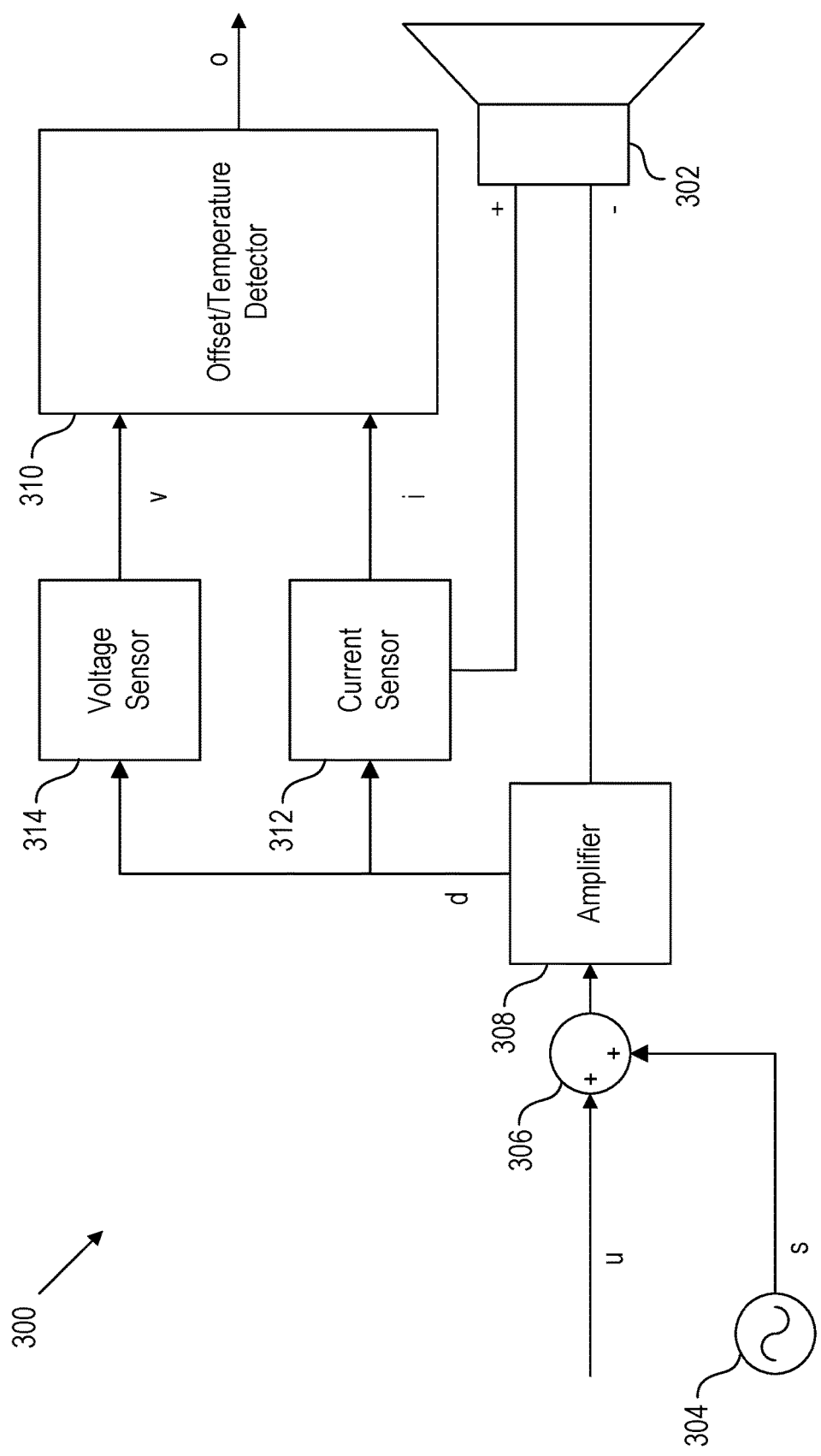
FIG. 3 depicts a schematic of an audio system with offset/temperature detector, according to an example.

FIG. 3 depicts a simplified schematic diagram of an example audio system 300 with offset detection and/or with temperature detection. Various features of audio system 300, as shown, are merely provided as examples; it should be understood that the offset detection and temperature detection system and methods described herein can be used in conjunction with any suitable audio system. At a high level, the offset/temperature detection of audio system 300 monitors at least one value representative of a relationship between the voice coil voltage and the voice coil current of at least one speaker to determine whether the offset has exceeded some predetermined distance or the temperature some predetermined value; whereupon, the magnitude of a drive signal provided to the speaker is reduced to prevent damage to the speaker. In certain examples, the at least one value representative of the relationship between the voice coil voltage and the voice coil current is determined from a voice coil voltage and voice coil current that result from a test signal provided to the speaker.

As shown in FIG. 3 a drive signal d, comprised of a program content signal u and test signal s, is provided to speaker 302. The program content signal u can comprise any signal to be played out of speaker 302, such as music, navigation, voice, etc., or some combination thereof. One of ordinary skill in the art will appreciate that program content signal u can be the result of processes not shown in FIG. 3, such as equalization, upmixing, downmixing, routing, etc.

Test signal s can be a tone, i.e., a sinusoidal waveform, produced by an oscillator 304 or by any suitable signal generator. The frequency of the test signal can be selected to be at the highest frequency available (i.e., near the Nyquist frequency), so that resistance of the voice coil of the speaker is readily distinguishable from the inductance. The test signal can be output at a frequency above the human audible range, so that it is undetectable to a user. In alternative examples, a more complex signal, comprising multiple frequencies, can be used. In either case, whether a tone or a more complex signal, the test signal can be situated an unused portion of the speaker 302 frequency spectrum, where offset can be reliably estimated. For example, if speaker 302 is a woofer, the test signal can be a portion of the program content signal in an unused portion of the woofer spectrum, such as a portion of the program content signal normally used with a tweeter, so that the user will not distinguish the test signal from the program content signal already provided within the cabin. However, in an alternative example, the test signal can be a portion of the program content signal already provided to speaker 302 (in which case, the test signal is subsumed as a portion of the program content signal, rather than its own distinct signal, and the provision of the program content signal to the speaker can be considered the provisioning of both the program content signal and the test signal).

As shown in FIG. 3, to produce drive signal d, program content signal u is summed at summing block 306 with a test signal s. (This step is omitted if the test signal is already included in the program content signal.) In the example shown, the summed signal is amplified by amplifier 308 and provided to speaker 310 as a drive signal d.

Offset/temperature detector 310 detector determines whether offset of the voice coil exceeds a predetermined distance or if the temperature of the voice coil exceeds a predetermined value. More particularly, based on the voltage and current resulting from the application of the test signal to the voice coil of speaker 302, offset/temperature detector 310 determines whether the offset of the voice coil of speaker 302 exceeds a predetermined distance or if the temperature exceeds a predetermined value, at which the drive signal d is preemptively reduced to avoid damaging speaker 302. Offset/temperature detector 310 determines the offset/temperature of the voice coil of speaker 302 according to at least value representative of the relationship between the voice coil voltage and the voice coil current, since, as described above, the impedance of the voice coil varies monotonically with offset displacement and with temperature, thus changing the relationship between voice coil voltage and voice coil current. It should be understood that, although offset/temperature detector 310 is described as being configured to monitor both offset and temperature of the voice coil, in various examples, it monitors only one of these conditions (e.g., only offset).

The values representative of the voice coil impedance can be determined from a measured current i, measured by a current sensor 312 receiving drive signal d, and a measured voltage v, measured by voltage sensor 314 receiving drive signal d. Current sensors and voltage sensors are widely known and any such sensor suitable for measuring the current and voltage to within the accuracy demanded by the methods for determining the offset of the speaker described in this disclosure. Amplifiers used for vehicle audio systems often include internal voltage and current sensors and can be used to measure the voltage and current provided to the speaker. Further, the outputs of the current sensor 312 and voltage sensor 314 can be filtered to isolate the components of these outputs resulting from the test signal. Thus, for example, the output of current sensor 312 and voltage sensor 314 can each be filtered with a respective bandpass filter, the cutoff frequencies of which being selected to isolate the voltage and current resulting from the test signal from the program content signal.

As will be described in more detail below, in various alternative examples, value(s) representative of the relationship between voice voltage and the voice coil current can be at least one of: a ratio of the voice coil voltage v and voice coil current i; a magnitude and phase of the impedance of the voice coil; the resistive and reactive parts of the impedance of the voice coil; a set of coefficients of a polynomial that relate the voice coil voltage v and voice coil current i; or a relationship as determined by a neural network. It should be understood that these are only provided as examples of values representative of the impedance and that other suitable values can be used in other examples. In various examples, as will be described below, the value(s) representative of the relationship between the voice coil voltage and the voice coil current can be determined, in part, by an adaptive filter, by a phase lock loop, a lock-in amplifier, or a neural network.

Figure 4A:
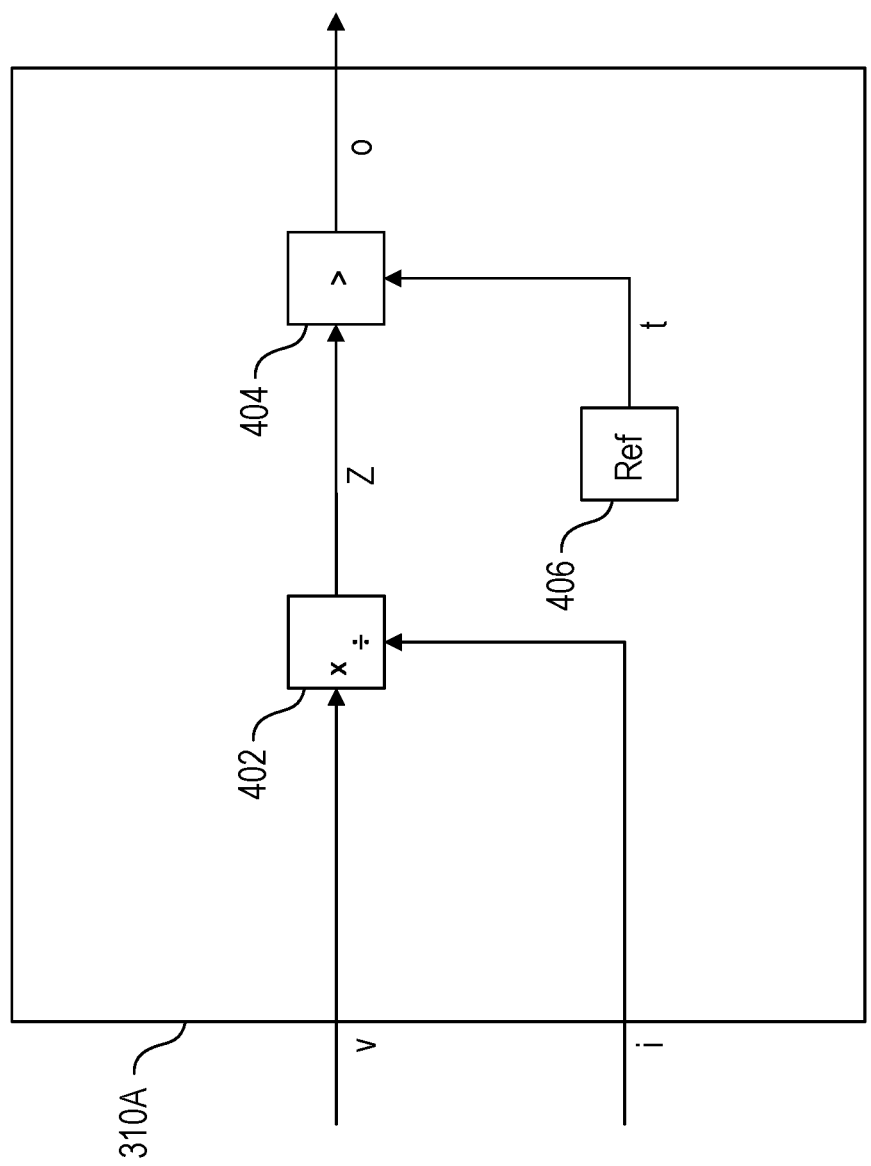
FIG. 4A depicts an offset/temperature detector, according to an example.

A first example of an offset/temperature detector 310 is shown in FIG. 4A as offset/temperature detector 310A. In this example, offset/temperature detector 310A calculates the offset or the temperature according to a ratio of the voice voltage v and the voice coil current i. The ratio Z of the voice coil voltage v to the voice coil current i, which is the impedance of the voice coil, is calculated at division block 402. In various examples, the ratio Z of the voice coil voltage v and the voice coil current i can be a ratio of the RMS, peak-to-peak, or average of the voice coil voice coil voltage v or the voice coil current i. The ratio Z of the voice coil voltage v and voice coil current i can be compared to a threshold at threshold comparison block 404, which compares the ratio Z to a reference value t (i.e., a predetermined threshold) and produces an output o based on the comparison.

The reference value t (in this example and in examples described below) can be selected to correlate to an offset displacement or temperature at which damage to the speaker 302 would result but for the reduction of the gain of drive signal; however, this is not strictly necessary. In an alternative example, the predetermined threshold t can be set at some value lower than the offset or temperature at which damage to the speaker would occur to provide a precautionary buffer to avoid damage from a potential rapid change in offset or temperature that can occur before detection.

Figure 4B:
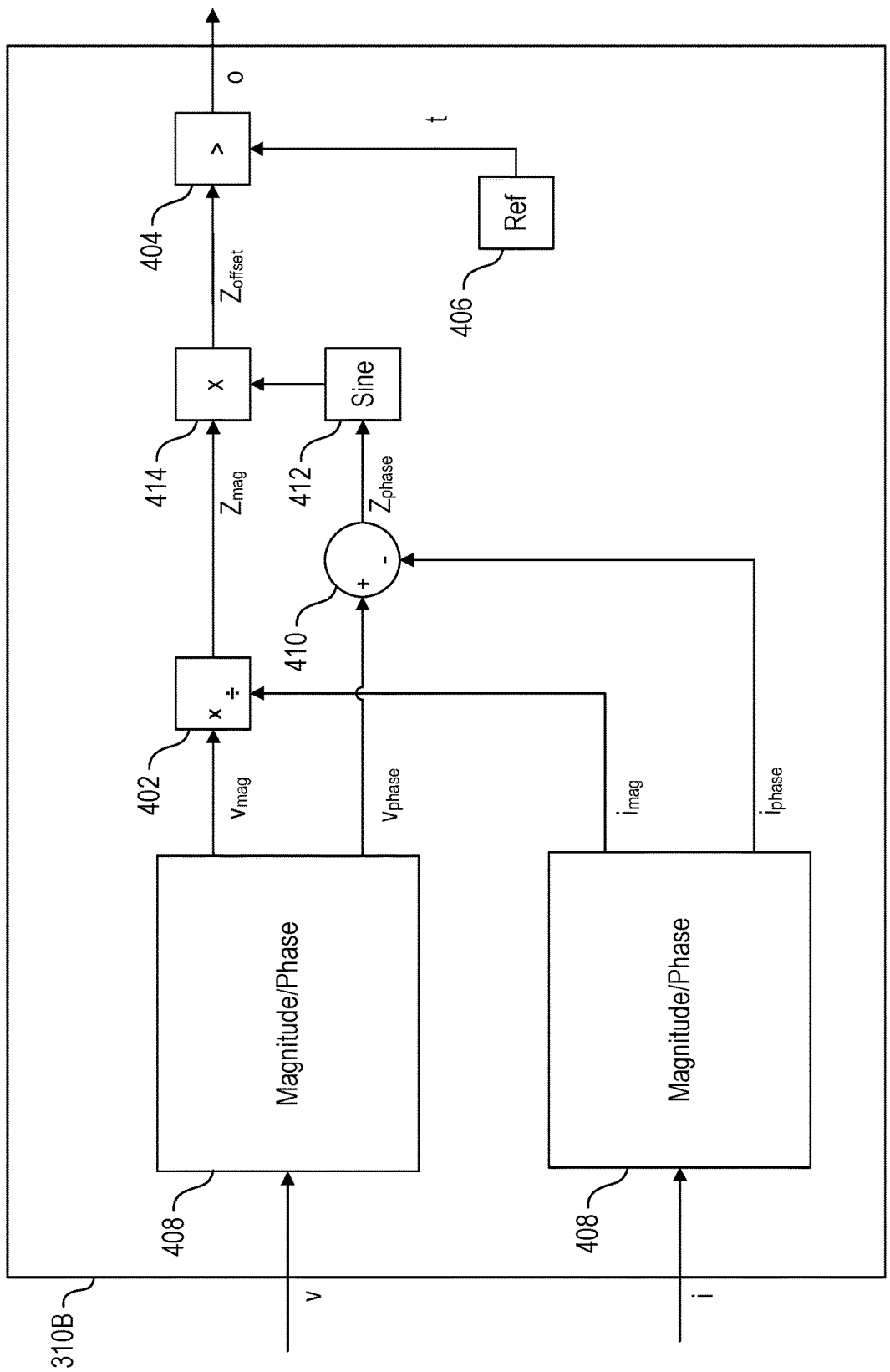
FIG. 4B depicts an offset detector, according to an example.
Figure 4C:
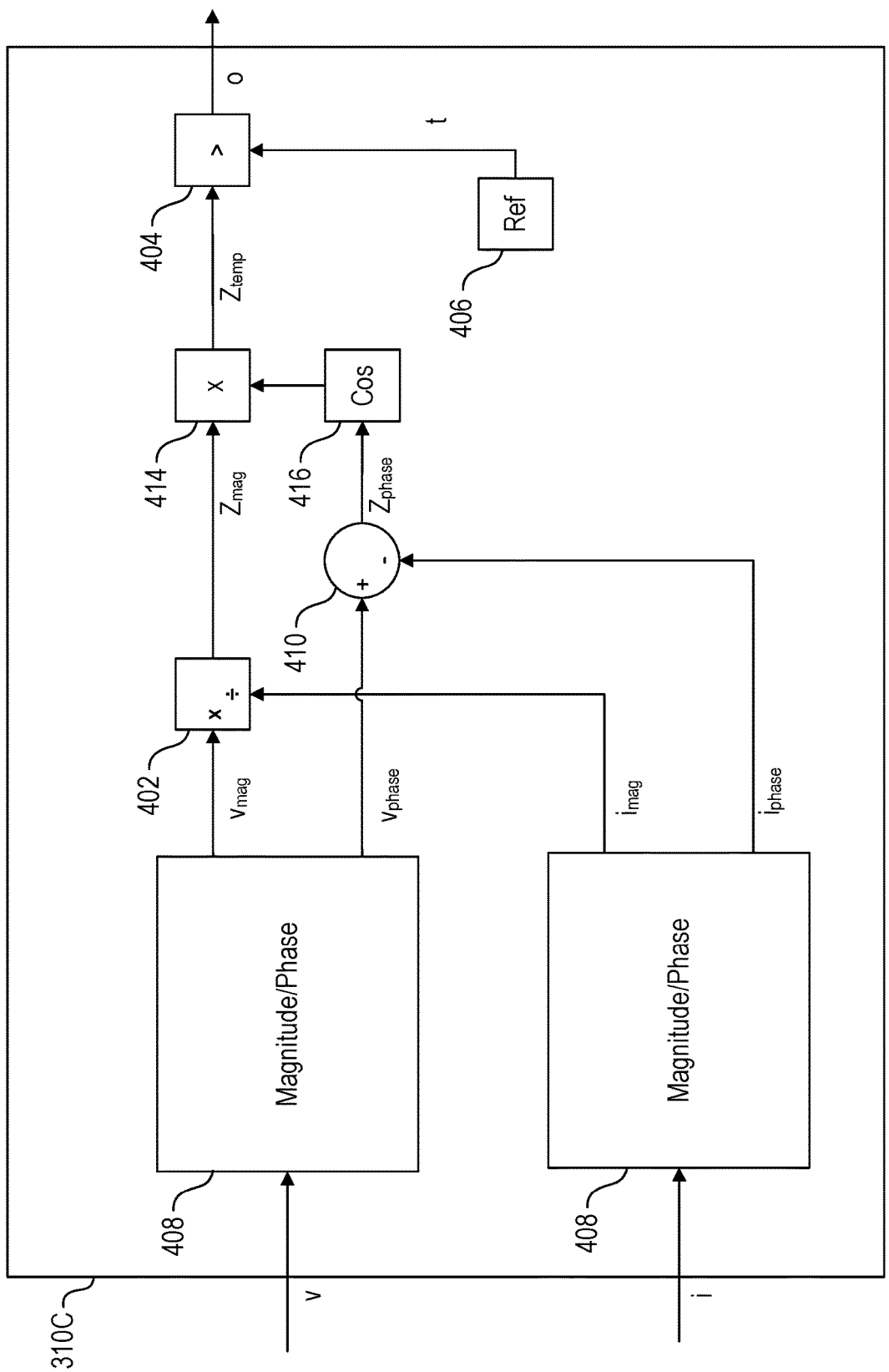
FIG. 4C depicts a temperature detector, according to an example.

Because changes in the magnitude of the impedance of the voice coil can occur from either an increase in offset or temperature, the ratio Z of the voice coil voltage v and voice coil current i is ambiguous and thus cannot be used to distinguish between a large offset displacement or an overheating voice coil. Accordingly, alternative examples of offset/temperature detector 310 are shown in FIGS. 4B and 4C. More particularly, FIG. 4B depicts offset detector 310B, which is configured to detect changes in offset of the voice coil, and FIG. 4C depicts temperature detector 310C, which is configured to detect changes in temperature of the voice coil. As will be described below, offset detector 310B and temperature detector 310C distinguish changes in impedance due to offset and changes in impedance due to temperature by taking into account the phase of the impedance.

As shown in FIG. 4B offset detector 310B, magnitude/phase detectors 408 receive the voice coil voltage v and voice coil current i and detect the magnitude of the voice coil voltage $v_{mag}$, the phase of the voice coil voltage $v_{phase}$, the magnitude of the voice coil current $i_{mag}$, and the phase of the voice coil current $i_{phase}$. Each magnitude/phase detector 408 can be any suitable device for determining the magnitude and phase of the input signal. In various examples, each magnitude phase detector 408 can be one of a phase-lock loop or a lock-in amplifier, as are known in the art and can be used to determine the magnitude and phase of the input signal.

As shown in FIG. 4B, the impedance magnitude $Z_{mag}$ can be determined from the ratio of the magnitude of the voice coil voltage $v_{mag}$ and the magnitude of the voice coil current $i_{mag}$, as determined according to divider block 402. The impedance phase $Z_{phase}$ can be determined from the difference between the phase of the voice coil voltage $v_{phase}$ and the phase of the voice coil current $i_{phase}$, according to difference block 410. The impedance magnitude $Z_{mag}$ can be found using the RMS, peak-to-peak, or average of the magnitude of the voice coil voltage $v_{mag}$ magnitude of the voice coil current $i_{mag}$.

In this example, the impedance phase $Z_{phase}$ operates as a value by which the impedance magnitude is scaled. More particularly, the impedance magnitude $Z_{mag}$ is multiplied at multiplier 414 by the sine of the impedance phase $Z_{phase}$ (i.e., sine($Z_{phase}$)), found by sine block 412. Accordingly, if the impedance phase $Z_{phase}$ is 90°, the impedance magnitude $Z_{mag}$ is effectively multiplied by a value of 1 (and thus remains unchanged); whereas if the impedance phase $Z_{phase}$ is 0° the output of multiplier 414 is effectively 0. Stated differently, the impedance magnitude $Z_{mag}$ is weighted by sine($Z_{phase}$). Thus, as the value of the impedance phase $Z_{phase}$ approaches 90°, the output of the multiplier 414, referred to in this disclosure as offset metric $Z_{offset}$, approaches $Z_{mag}$, and as the impedance phase $Z_{phase}$ approaches 0°, the offset metric $Z_{offset}$ approaches 0. In this way, if the value of $Z_{phase}$ reveals the presence of an inductance (by the presence of an approximately 90° phase shift), therefore implying the presence of a large offset, the magnitude of impedance $Z_{mag}$ is compared to a reference t at comparison block 404 in the same manner as described in FIG. 4A. But if the value of $Z_{phase}$ does not reveal the presence of an inductance, implying the presence of a high voice coil temperature but not a large offset, then a scaled version of the magnitude of the impedance $Z_{mag}$ is compared to the reference signal t, such that the output o does not indicate the presence of a large offset.

In an alternative example, rather than multiply the impedance magnitude $Z_{mag}$ by sine of impedance phase $Z_{phase}$, a decision tree can be employed (similar to the decision tree described in connection with FIG. 5, below) to determine whether the values of impedance magnitude $Z_{mag}$ and impedance phase $Z_{phase}$ represent an offset of greater than a predetermined distance. For example, the decision tree can determine if the difference between 90° the impedance phase $Z_{phase}$ exceeds a predetermined phase threshold value (e.g., 30°). If the difference exceeds the phase threshold, it can be determined that the offset does not exceed the predetermined distance, since the phase does not indicate a large inductive component. However, if the phase does not exceed the threshold, the impedance magnitude $Z_{mag}$ can be compared to the predetermined threshold to determine if the impedance is representative of an offset greater than a predetermined distance.

Turning to FIG. 4C, temperature detector 310C follows the example of offset detector 310B, but is modified to multiply the impedance magnitude $Z_{mag}$ by the cosine of the impedance phase $Z_{phase}$ (i.e., cos($Z_{phase}$). Thus, as the impedance phase $Z_{phase}$ approaches 0° the impedance magnitude $Z_{mag}$ is multiplied by 1 (i.e., left unchanged), but as the impedance phase $Z_{phase}$ approaches 90°, the impedance magnitude $Z_{mag}$ is scaled to 0. Thus, temperature detector 310C functions to minimize the impedance magnitude $Z_{mag}$ if the impedance indicates a large inductive portion, but to maximize $Z_{mag}$ if the impedance indicates a large resistive portion (suggesting that the impedance magnitude is representative of the temperature of the voice coil). This scaled impedance magnitude $Z_{mag}$ (shown as temperature metric $Z_{temp}$ in FIG. 4D) can be compared to a reference signal t at comparison block 404 to determine whether the voice coil temperature has exceeded a predetermined temperature. (It should be understood that reference signal t as used in FIGS. 4A, 4B, and 4C is not necessarily the same value in each example, as different values are being measured.)

Again, rather than multiply the impedance magnitude $Z_{mag}$ by the cosine of impedance phase $Z_{phase}$, a decision tree can be employed to determine whether the values of impedance magnitude $Z_{mag}$ and impedance phase $Z_{phase}$ represent a temperature of greater than a predetermined value. For example, the decision tree can determine if the difference between 0° and the impedance phase $Z_{phase}$ exceeds a predetermined phase threshold value (e.g., 30°). If the difference exceeds the phase threshold, it can be determined that the offset does not exceed the threshold temperature, since a large resistive component to the impedance is not detected. However, if the phase does not exceed the threshold, the impedance magnitude $Z_{mag}$ can be compared to the predetermined threshold to determine if the impedance is representative of a temperature greater than a predetermined value.

Figure 4D:
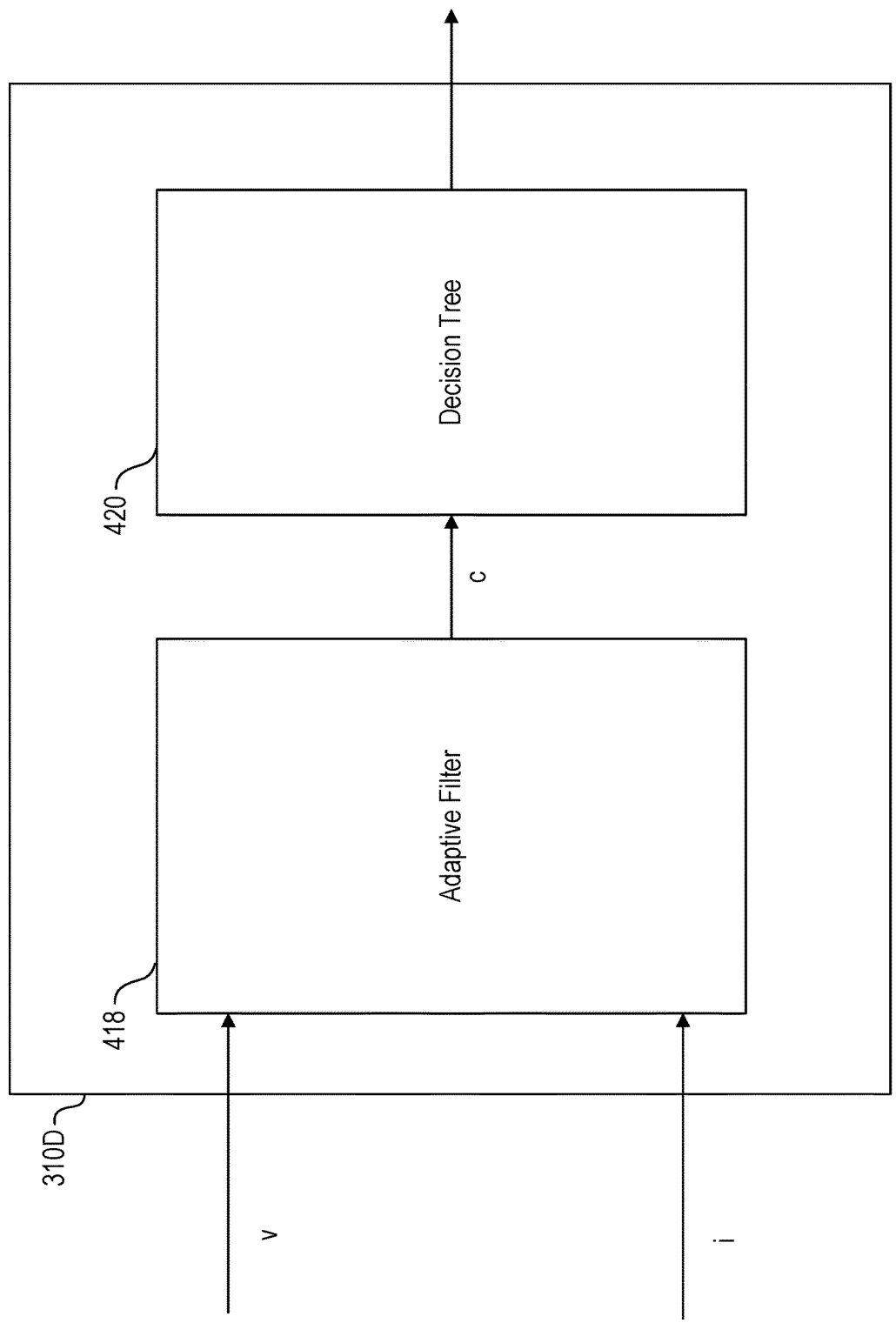
FIG. 4D depicts an offset/temperature detector, according to an example.

In an alternative example, as shown in FIG. 4D, the at least one value representative of the relationship between the voice coil voltage v and voice coil current i—by which offset/temperature detector 310D determines whether the voice coil offset exceeds the predetermined distance or the voice coil temperature exceeds the predetermined value—are the coefficients of a polynomial that relate the voice coil voltage v to the voice coil current i. For example, the voltage of the voice coil can be approximated as $$v(t) \approx R_e \cdot i(t) + \frac{d}{dt}(L_e i(t)) \tag{1}$$

where $R_e$ is a resistive component of the voice coil and $L_e$ is the inductive component. The derivative of the voice coil current, as it appears in the inductive term of Eq. (1) can be rewritten, by the backward-difference approximation, as Eq. (2)

$$\frac{di(t)}{dt} \approx \frac{i(t) - i(t-h)}{h} \tag{2}$$

where h is the time difference between successive samples of audio system 300. Thus, the voice coil voltage v of Eq. (1) can be approximated as Eq. (3):

$$v(t) \approx R_e \cdot i(t) + \frac{L_e}{h} \cdot (i(t) - i(t-h)) \tag{3}$$

Thus, in the discrete-time domain the voice coil voltage v can be approximated as Eq. (4):

$$v[n] \approx x_0 i[n] + x_i[n-1] \tag{4}$$

The coefficients $x_0$, $x_i$, which are those that best relate the measured voice coil voltage v and voice coil current i, can be used as values representative of the impedance of voice coil that can be used to determine whether the offset of the voice coil exceeds a predetermined distance. Further, in alternative examples, additional coefficients can used ($x_0$, $x_1$, $x_2$ . . . ) as Eq. (4) can be expanded backward to additional previous samples (i[n], i[n−1], i[n−2] . . . ).

In an alternative example, Eq. (4) can be transposed to write the voice coil current i in terms of successive voice coil voltage samples. In this example, the coefficients of the voice coil voltage samples can be used as the values representative of the impedance of the voice coil to determine whether the offset of the voice coil exceeds a predetermined distance. Further, Eq. (4) is merely provided as an example of a polynomial that describes the relationship between voice coil voltage and voice coil current. Alternative examples can model the relationship of voltage to current with a non-linear variant of Eq. (4), as can be determined through further non-linear analysis and/or empirical methods.

Whether the coefficients relate samples of the voice coil current to the voice coil voltage or relate samples of the voice coil voltage to the voice coil current, the coefficients can be found using an adaptive filter, such as a least means square (LMS) filter or recursive least squares (RLS) filter, configured to determine which values of the coefficients best relate the voice coil voltage v and the voice coil current i, as found by current sensor 312 and voltage sensor 314. (In alternative examples, other methods of determining the coefficient values, besides using an adaptive filter, can be used. Indeed, various mathematical methods for determining the coefficients of a polynomial are understood in the art and can be employed in place of an adaptive filter.)

Figure 5:
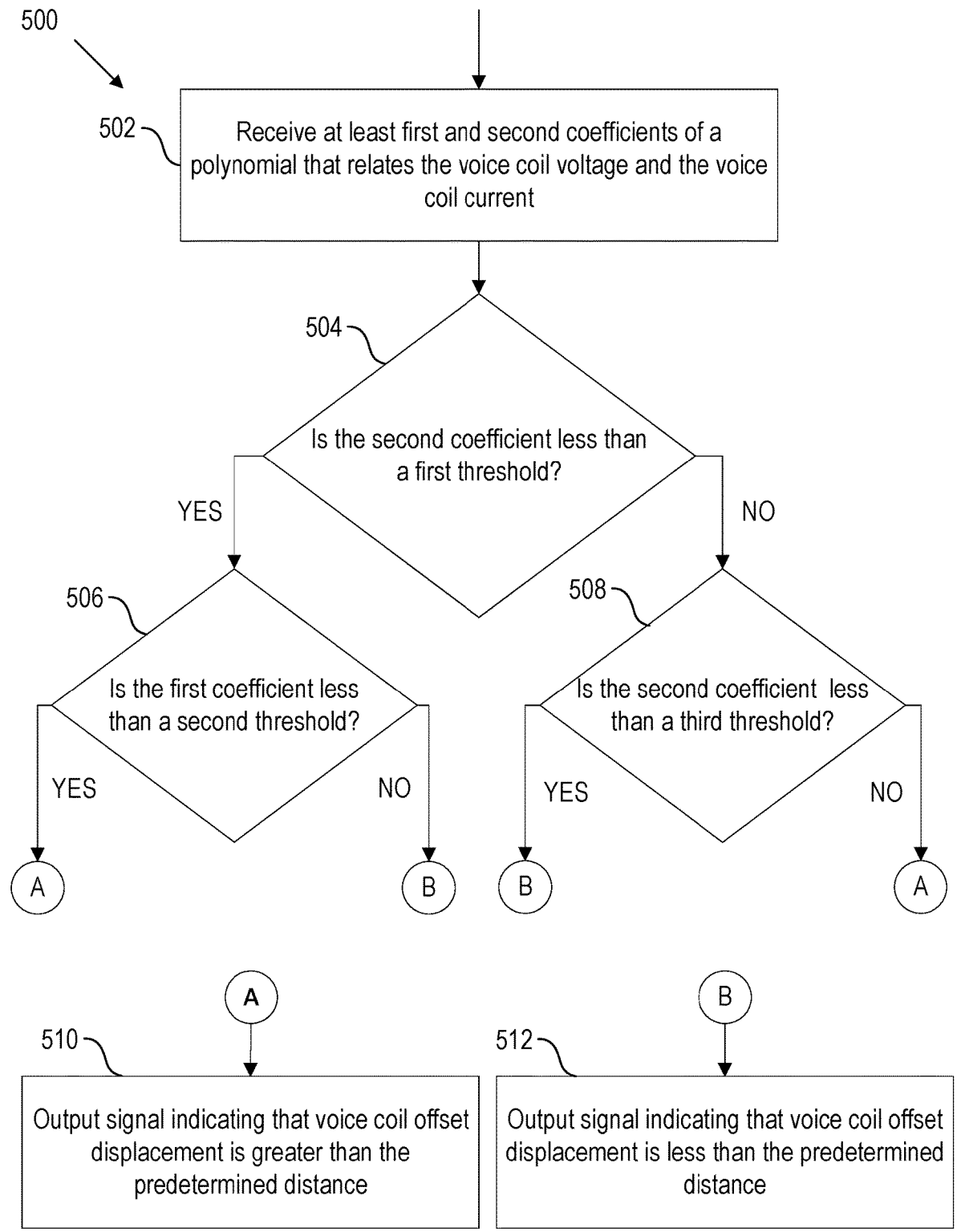
FIG. 5 depicts a flowchart of a decision tree, according to an example.

The output of the adaptive filter, i.e., the values of the coefficients (represented in FIG. 4C as coefficient signal c) can be input to a decision tree 420, an example of which is represented as a flowchart in FIG. 5 as method 500. As shown in FIG. 5, the decision tree 420 compares the found coefficients to various thresholds to determine whether the voice coil offset or temperature has exceeded a predetermined value. The nature of the decision tree, including which coefficient values are compared to what thresholds at various steps can be determined empirically, theoretically, or according to a machine-learning algorithm. For example, a machine-learning process employed to determine when coefficient values $x_0$, $x_1$ of Eq. (4) represent the voice coil offset exceeding the predetermined threshold resulted in the example decision tree of FIG. 5. As shown in step 502, first and second coefficient values ($x_0$, $x_1$) are received. At step 504, the second coefficient, $x_1$, is compared to a first threshold (e.g., 0.164304). If the second coefficient is less than the first threshold, at step 506 the first coefficient value, $x_0$, is compared to a second threshold. (e.g., −0.923162) If the first coefficient value is less than the second threshold, it is determined that that the voice coil offset is greater than a predetermined distance. At step 510, signal is output indicating that the displacement is greater than the predetermined distance. If, at step 506, it is determined that the first coefficient value is greater than the second threshold, it is determined that the offset is less than the predetermined distance and, at step 512, the output signal indicates that the offset is less than the predetermined distance.

Returning to step 504, if the second coefficient is greater than the first threshold, then, at step 508, the second coefficient is compared to a third threshold (e.g., 0.17927). If the second coefficient value is less than the third threshold, it is determined that the offset is less than the predetermined distance and, at step 512, the output signal indicates that the offset is less than the predetermined distance. If, at step 508, it is determined that the first coefficient value is greater than the second threshold, it is determined that that the voice coil offset is greater than a predetermined distance. At step 510, the output signal indicates that the displacement is greater than the predetermined distance.

Alternatively, by adjusting which coefficients are compared to what thresholds at various steps, decision tree can configured to estimate when the voice coil temperature exceeds a predetermined value. In yet another example, the decision tree 420 can be configured to detect when either the offset exceeds a predetermined distance or the temperature exceeds a predetermined value.

Further, it should be understood that the decision tree described in connection with FIG. 5, including which coefficient values are compared to what thresholds, is only one example of a suitable decision tree for determining when the coefficient values are representative of voice coil offset exceeding the predetermined distance. Indeed, the coefficient values that indicate an offset exceeding the predetermined distance or a temperature exceeding a predetermined value will depend upon the particular speaker as well as the predetermined distance or value that is selected. Further, higher-order decision trees, featuring additional branches can be used to increase accuracy. In addition, a different number of coefficients can be used as inputs to the decision tree (e.g., $x_0$, $x_1$, $x_2$), which will alter the number of branches and thresholds used. Additionally, the nature of the decision tree will depend upon whether the coefficients are of a polynomial that relates the voice coil voltage measurements to the voice coil current or relate the voice coil current measurements to the voice coil voltage.

Further, it should be understood that, in addition to the values representative of the impedance discussed above, other suitable values can be used to estimate the offset of the voice coil. For example, it is conceived that the impedance of the voice coil can be represented as a complex value comprising a resistive and reactive part. The resistive and reactive parts, like the example of FIGS. 4A-4D can be compared to thresholds, e.g., in a decision tree, to estimate whether the voice coil offset is greater than the predetermined distance or the voice coil temperature is greater than a predetermined value.

Additionally, the above examples estimate offset or temperature according to the values representative of impedance but do not include the additional step of determining the actual offset distance. In other words, the above examples determine when the values representative of the impedance of the voice coil indicate that the offset is greater than the predetermined distance or the temperature exceeds a predetermined value, but do not actually calculate what the distance or temperature is. Alternatively, these examples can be modified to calculate the offset displacement or the temperature from the values representative of the impedance of the voice coil and to compare the calculated offset or temperature to the predetermined distance or value to determine whether it exceeds it. Generally, though, because this step is not required, it can be excluded in favor of the more economical approaches described above.

In response to determining that the value(s) representative of the relationship between the voice coil voltage and voice coil current is indicative of an offset greater than the predetermined distance or a temperature greater than a predetermined value, a magnitude of the drive signal can be reduced to avoid damaging the speaker. This can be implemented by a reduction of the gain of amplifier 308; however, other methods for reducing the magnitude of the drive signal, such as the inclusion of some variable attenuator that can selectively attenuate the output of amplifier 308, can be employed.

Further, the amount of reduction to the magnitude of the drive signal can be related to the value(s) representative of the relationship between the voice coil voltage and the voice coil current. In other words, increasing reductions to the drive signal magnitude of the drive signal can be effected as the offset or temperature increases. This can be accomplished by implementing multiple thresholds in the above examples, each of which correspond to a different magnitude reduction of the drive signal. Thus, the example described in connection with FIG. 4A can be modified to compare the ratio Z to multiple thresholds, each successively greater threshold corresponding to a successively greater magnitude reduction of the drive signal, such that if the ratio Z exceeds the greatest threshold, the greater magnitude reduction is effected. Likewise, the example described in connection with FIG. 4B can be modified to compare the scaled ratio Z to multiple thresholds that correspond to increasingly greater magnitude reductions. And similarly, the decision of example of FIGS. 4C-5 can be modified to determine how large magnitude reduction to effect according to the determined polynomial coefficients.

In an alternative example, the offset can be detected using only a test signal (i.e., the drive signal does not comprise an additional program content signal). In this example, rather than reducing a magnitude of the drive signal, the maximum potential output to speaker 302 can be limited until the offset is resolved. Thus, for example, if an offset is detected, the maximum gain provided to speaker 302 can be governed to within a predetermined limit so that a user, turning on a source of program content, will be limited in the maximum volume that the speaker will produce.

In addition, the magnitude of the test signal can be depend upon the magnitude of the program content signal. Accordingly, a higher magnitude test signal can be introduced as the magnitude of the program content signal increases. Likewise, the values of the thresholds employed in the various examples can depend upon the magnitude of the test signal used, since a larger test signal will tend to induce a larger voice coil voltage and voice coil current.

In yet another example, offset/temperature detector 310 can be implemented as a neural network, trained to detect a relationship between the voice coil voltage and the voice coil current and to determine when a value representative of this relationship indicates that the voice coil offset or temperature exceeds a predetermined threshold. For example, such a neural network can be trained with a historical set of data of voice coil voltage and voice coil current and the associated offsets/temperatures of the voice coil. From this data, the neural network can characterize a mathematical relationship between the voice coil voltage and the voice coil current and identify when some value of this relationship indicates that the offset or temperature has exceeded some predetermined threshold.

In an example, the functions and examples of the offset/temperature detector 310, which are described in more detail in connection with FIGS. 4A-4D, can be stored a non-transitory storage medium and executed by one or more processors. Further, all or part of the functions can be implemented as special purpose logic circuitry, e.g., an FPGA (field-programmable gate array) and/or an ASIC (application-specific integrated circuit), along with any associated hardware, or by some combination of processors, special-purpose logic circuitry, and associated hardware.

FIG. 6 depicts a method 600 for detecting a predetermined voice coil offset or temperature and for reducing the drive signal to the voice coil to prevent damage to the speaker when such offset or temperature is detected. The steps of method 600 can be implemented by an audio system, such as audio system 300, that includes an offset/temperature detector, such as offset/temperature detector 310; however, any suitable audio system can be used. While the steps of this method have been described in the context of an audio system disposed in a vehicle, the method is applicable in any context that a speaker drive signal is to be conditioned on a detected impedance—as this relates to offset and temperature—of the voice coil. All or part of the steps of method 600 can be stored in a non-transitory storage medium and carried by one or more processors. Additionally, all or part of the steps can be implemented as special purpose logic circuitry, e.g., an FPGA (field-programmable gate array) and/or an ASIC (application-specific integrated circuit), along with any associated hardware, or by some combination of processors, special-purpose logic circuitry, and associated hardware. Furthermore, it should be understood that, in certain examples, method 600 can detect either a predetermined offset or temperature or only one of an offset or a temperature.

At step 602, a drive signal comprised of a program content signal and a test signal is provided to the voice coil of the speaker. The program content signal can comprise any signal to be played out of speaker 302, such as music, navigation, voice, etc., or some combination thereof. One of ordinary skill in the art will appreciate that program content signal can be the result of processes such as equalization, upmixing, downmixing, routing, etc. Test signal s can be a tone, i.e., a sinusoidal waveform, produced by an oscillator or by any suitable signal generator. The frequency of the test signal can be selected to be at the highest frequency available (i.e., near the Nyquist frequency), so that resistance of the voice coil of the speaker is readily distinguishable from the inductance. The test signal can be output at a frequency above the human audible range, so that it is undetectable to a user. In alternative examples, a more complex signal, comprising multiple frequencies, can be used. In either case, whether a tone or a more complex signal, the test signal can be situated an unused portion of the speaker frequency spectrum, where offset can be reliably estimated. For example, if the speaker is a woofer, the test signal can be a portion of the program content signal in an unused portion of the woofer spectrum, such as a portion of the program content signal normally used with a tweeter, so that the user will not distinguish the test signal from the program content signal already provided within the cabin. However, in an alternative example, the test signal can be a portion of the program content signal already provided to the speaker (in which case, the test signal is subsumed as a portion of the program content signal, rather than its own distinct signal, and the provision of the program content signal to the speaker can be considered the provisioning of both the program content signal and the test signal).

At step 604, at least one value representative of a relationship between a voice coil voltage and a voice coil current, according to a voice coil voltage and a voice coil current resulting from the test signal. As described in connection with FIGS. 6B-6D, the at last one value representative of the relationship between the voice coil voltage and the voice coil current, in various nonlimiting examples, a ratio of the voice coil voltage and voice coil current, a magnitude and phase of the voice coil impedance, a resistive part and an reactive part of the voice coil impedance, the coefficients of a polynomial relating the voice coil voltage and the voice coil current, or a value determined by a neural network.

The voice coil current can be determined by a current sensor receiving the drive signal and the voice coil voltage can be determined by a voltage sensor receiving the drive signal. Current sensors and voltage sensors are widely known and any such sensor suitable for measuring the current and voltage to within the accuracy demanded by the methods for determining the offset of the speaker described in this disclosure. Amplifiers used for vehicle audio systems often include internal voltage and current sensors and can be used to measure the voltage and current provided to the speaker. Further, the outputs of the current sensor and voltage sensor can be filtered to isolate the components of these outputs resulting from the test signal. For example, the outputs of the current sensor and the voltage sensor can each be filtered with a respective bandpass filter, the cutoff frequencies of which being selected to isolate the voltage and current resulting the test signal from the program content signal.

At step 606, it is determined whether the at least one value indicates that an offset displacement or temperature of the voice coil exceeds a predetermined threshold (i.e., a predetermined offset distance or a predetermined temperature value). In various examples, as will be described below, this step can include comparing a ratio of the voice voltage and voice coil current to a threshold (as described in connection with FIG. 6B), determining whether the voice impedance phase and magnitude indicate that an offset displacement or temperature of the voice coil exceeds a predetermined threshold (as described in connection with FIG. 6C), and comparing at least one coefficient of a plurality of coefficients of a polynomial that relates the voice coil voltage to the voice coil current to a threshold (as described in connection with FIG. 6D).

Figure 6A:
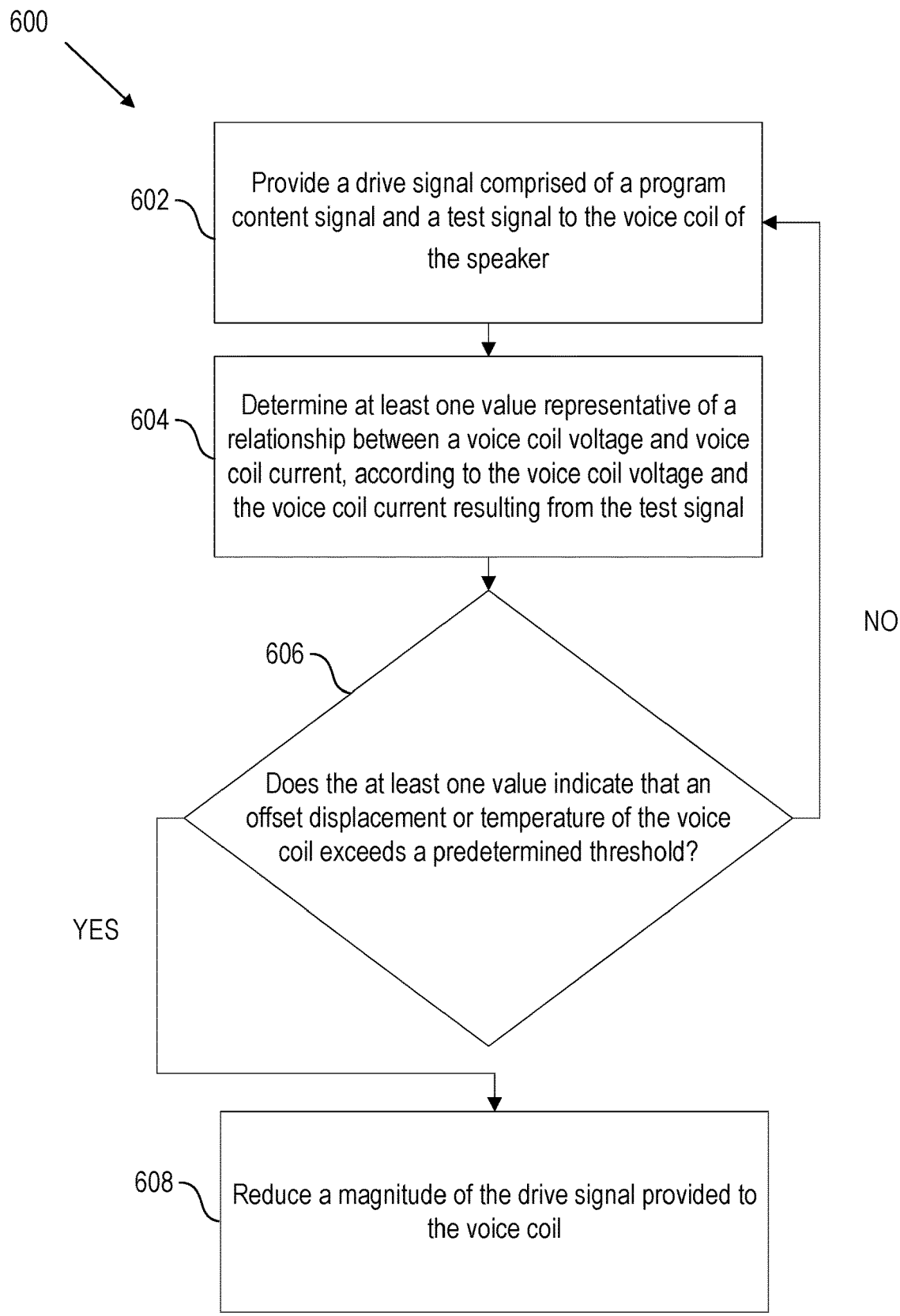
FIG. 6A depicts a flowchart of a method for determining the offset or temperature of a voice coil, according to an example.
Figure 6B:
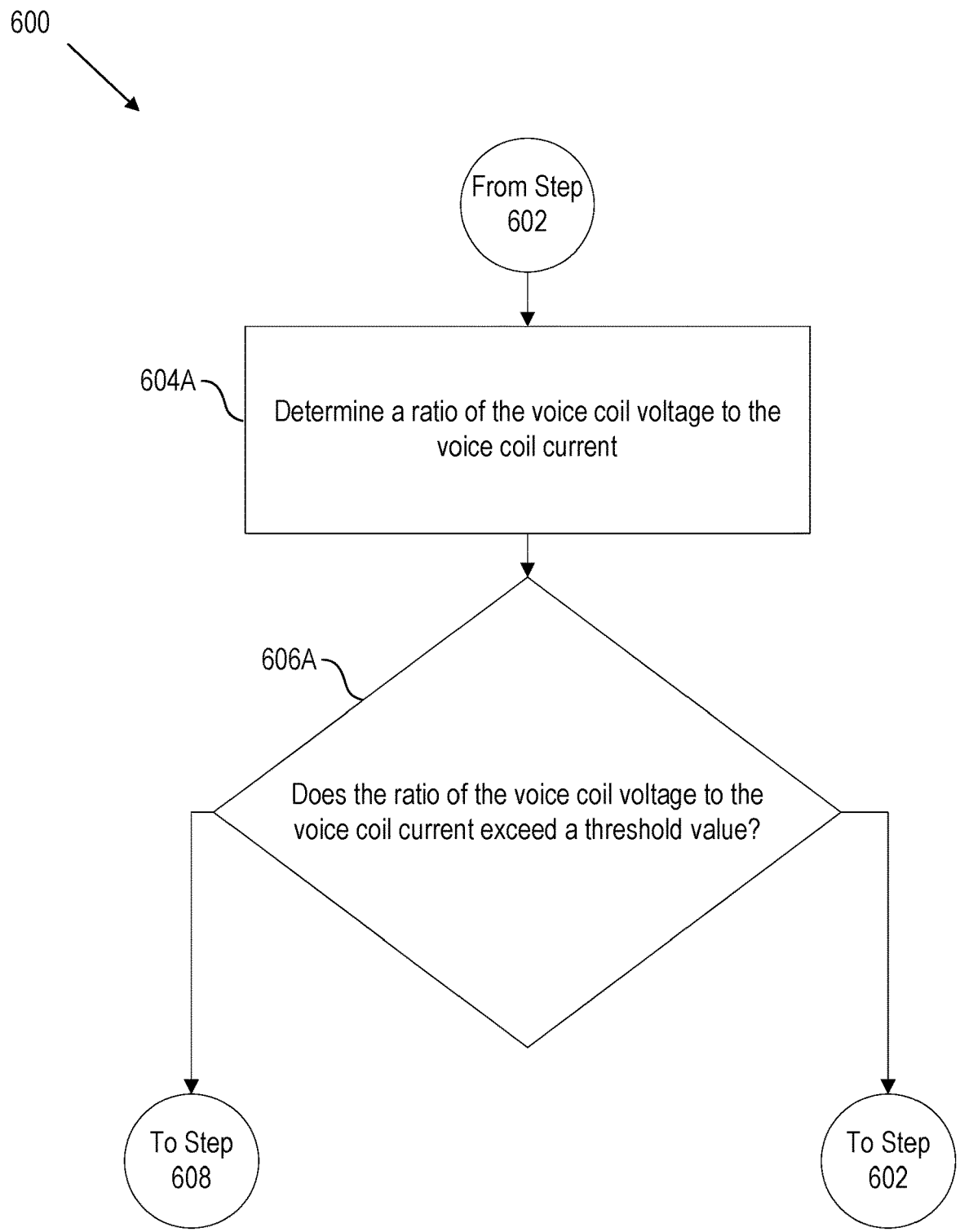
FIG. 6B depicts a flowchart of a method for determining the offset or temperature of a voice coil, according to an example.
Figure 6C:
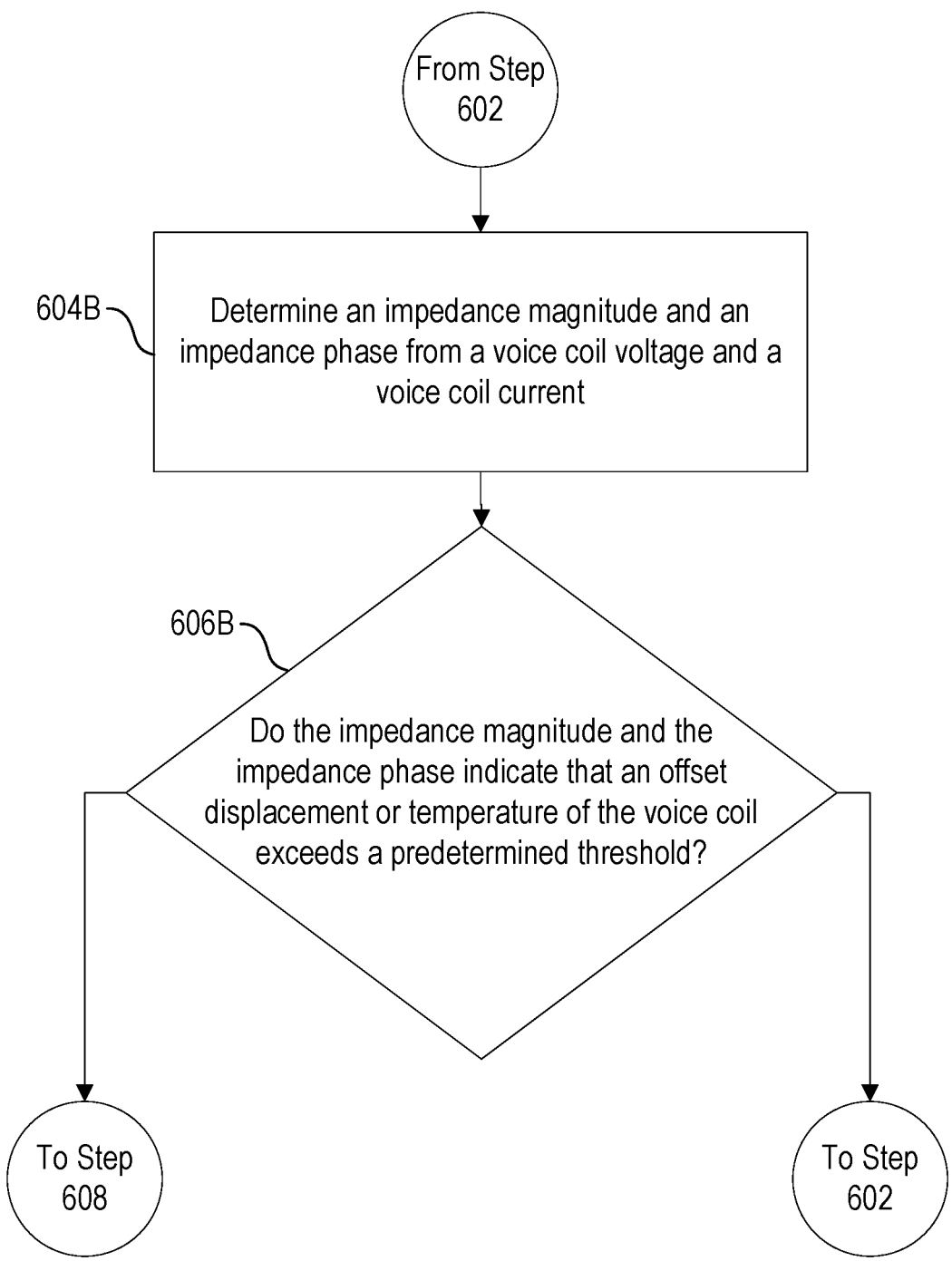
FIG. 6C depicts a flowchart of a method for determining the offset or temperature of a voice coil, according to an example.
Figure 6D:
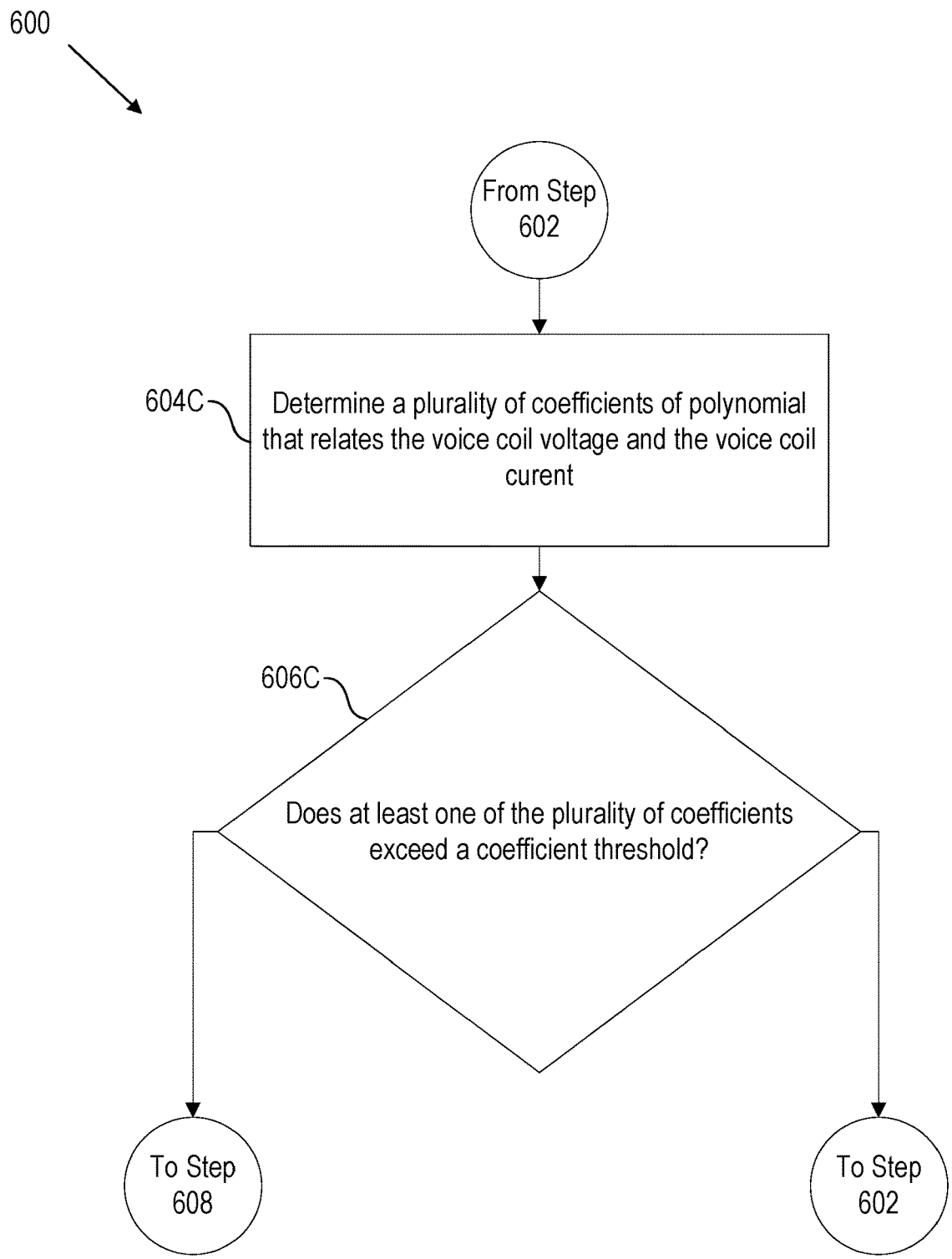
FIG. 6D depicts a flowchart of a method for determining the offset or temperature of a voice coil, according to an example.

FIGS. 6B-6D depict various alternative examples of steps 604 and 606. Turning first to FIG. 6B, at step 604A. The ratio of the voice coil voltage to the voice coil current, which is the impedance of the voice coil, is calculated. In various examples, the ratio of the voice coil voltage and the voice coil current can be a ratio of the RMS, peak-to-peak, or average of the voice coil voice coil voltage or the voice coil current.

At step 606A, the ratio of the voice coil voltage and voice coil current is compared to a threshold. The threshold can be selected to correlate to an offset displacement or temperature at which damage to the speaker 302 would result but for the reduction of the gain of drive signal; however, this is not strictly necessary. In an alternative example, the predetermined threshold can be set at some value lower than the offset or temperature at which damage to the speaker would occur to provide a precautionary buffer to avoid damage from a potential rapid change in offset or temperature that can occur before detection. Because changes in the magnitude of the impedance of the voice coil can occur from either an increase in offset or temperature, the ratio of the voice coil voltage and voice coil current is ambiguous and thus cannot be used to distinguish between a large offset displacement or an overheating voice coil.

Turning to FIG. 6C, there is shown an example of steps 604 and 606 which can distinguish changes in impedance due to offset and changes in impedance due to temperature by taking into account the phase of the impedance. As shown in FIG. 6C, at step 604B, a voice coil impedance magnitude and impedance phase are determined from the voice coil voltage and voice coil current. In an example, the impedance magnitude and impedance phase can be determined from the phase of the voice coil voltage, the magnitude of the voice coil current, and the phase of the voice coil current, as output by a magnitude phase detector, such as a phase-lock loop or a lock-in amplifier. More particularly, the impedance magnitude can be determined from ratio of the magnitude of the voice coil voltage and the magnitude of the voice coil current. The impedance phase can be determined from the difference between the phase of the voice coil voltage and the phase of the voice of the phase of the voice coil current. Further, it should be understood that the impedance magnitude can be found using the RMS, peak-to-peak, or average of the magnitude of the voice coil voltage magnitude of the voice coil current.

At step 606B, it is determined whether the impedance magnitude and the impedance phase indicate that an offset displacement or temperature of the voice exceeds a predetermined threshold. As will be described below, this step can be accomplished in a number of ways, such as by comparing an impedance magnitude, weighted by a sine or cosine of the impedance phase, or by a decision tree.

In a first such example, the impedance phase operates as a value by which the impedance magnitude is scaled. For example, to determine whether the offset displacement of the voice coil exceeds a predetermined threshold, the impedance magnitude is multiplied by the sine of the impedance phase. Accordingly, if the impedance phase is 90°, the impedance magnitude is effectively multiplied by a value of 1 (and thus remains unchanged); whereas if the impedance phase is 0° the impedance magnitude is weighted to effectively 0. Thus, as the value of the impedance phase approaches 90°, the impedance magnitude approaches the value of the impedance magnitude, and as the impedance phase approaches 0°, the weighted impedance magnitude approaches 0. In this way, if the value of the impedance magnitude reveals the presence of an inductance (by the presence of an approximately 90° phase shift), therefore implying the presence of a large offset, the magnitude of the impedance is simply compared to a threshold, similar to the example of FIG. 6C, to determine if the offset exceeds the predetermined distance. But if the value of impedance phase does not reveal the presence of an inductance, implying the presence of a high voice coil temperature but not a large offset, then a scaled version of the magnitude of the impedance is compared to the threshold.

In an alternative example, rather than multiply the impedance magnitude by the sine of impedance phase, a decision tree can be employed (similar to the decision tree described in connection with FIG. 5) to determine whether the values of impedance magnitude and impedance phase represent an offset of greater than a predetermined distance. For example, the decision tree can determine if the difference between 90° the impedance phase exceeds a predetermined phase threshold value (e.g., 30°). If the difference exceeds the phase threshold, it can be determined that the offset does not exceed the predetermined distance, since the phase does not indicate a large inductive component. However, if the phase does not exceed the threshold, the impedance magnitude can be compared to the predetermined threshold to determine if the impedance is representative of an offset greater than a predetermined distance.

Alternatively, to determine whether the temperature of the voice coil exceeds a threshold, the above example is modified to multiply the impedance magnitude by the cosine of the impedance phase. Thus, as the impedance phase approaches 0° the impedance magnitude is multiplied by 1 (i.e., left unchanged), but as the impedance phase approaches 90°, the impedance magnitude is scaled to 0. This functions to minimize the impedance magnitude if the impedance indicates a large inductive portion, but to maximize if the impedance indicates a large resistive portion (suggesting that the impedance magnitude is representative of the temperature of the voice coil). This scaled impedance magnitude can compared to a threshold determine whether the voice coil temperature has exceeded a predetermined temperature. (It should be understood that the thresholds described in the various examples of method 600 are not necessarily the same; instead, the threshold is tailored according to a variety of factors including the nature of the speaker and whether offset or temperature is measured.)

Further, rather than multiply the impedance magnitude by the cosine of impedance phase, a decision tree can be employed to determine whether the values of impedance magnitude and impedance phase represent a temperature of greater than a predetermined value. For example, the decision tree can determine if the difference between 0° and the impedance phase $Z_{phase}$ exceeds a predetermined phase threshold value (e.g., 30°). If the difference exceeds the phase threshold, it can be determined that the offset does not exceed the threshold temperature, since a large resistive component to the impedance is not detected. However, if the phase does not exceed the threshold, the impedance magnitude can be compared to the predetermined threshold to determine if the impedance is representative of a temperature greater than a predetermined value.

Turning to FIG. 6D, at step 604C the at least one value representative of the relation between voice coil voltage and voice coil current are the coefficients of a polynomial that relates the voice coil voltage and the voice coil current. For example, the voltage of the voice coil can be approximated according to the polynomial of Eq. (4), which relates the voice coil voltage to the voice coil current, or according to the transpose of Eq. (4), which relates the voice coil current to the voice coil voltage. Further, whether Eq. (4) or its transpose is used, any number of coefficients can be used, as these equations can be expanded back into time to additional samples.

In addition, whether the coefficients relate samples of the voice coil current to the voice coil voltage or relate samples of the voice coil voltage to the voice coil current, the coefficients can be determined using an adaptive filter, such as a least means square (LMS) filter or recursive least squares (RLS) filter, configured to determine which values of the coefficients best relate the voice coil voltage and the voice coil current. (In alternative examples, other methods of determining the coefficient values, besides using an adaptive filter, can be used. Indeed, various mathematical methods for determining the coefficients of a polynomial are understood in the art and can be employed in place of an adaptive filter.)

At step 606C, at least one of the plurality of coefficients is compared to a threshold to determine whether the coefficient(s) exceeds the threshold. An example of this is described in connection with the decision tree of FIG. 5, where the coefficients are compared to various thresholds. A decision tree like the decision tree of FIG. 5 can be used to determine whether the coefficient(s) of the polynomial indicate that the voice coil offset or displacement exceed a predetermined threshold The nature of the decision tree, including which coefficient values are compared to what thresholds at various steps can be determined empirically, theoretically, or according to a machine-learning algorithm.

Further, it should be understood that the decision tree described in connection with FIG. 5, including which coefficient values are compared to what thresholds, is only one example of a suitable decision tree for determining when the coefficient values are representative of voice coil offset exceeding the predetermined distance. Indeed, the coefficient values that indicate an offset exceeding the predetermined distance or a temperature exceeding a predetermined value will depend upon the particular speaker as well as the predetermined distance or value that is selected. Further, higher-order decision trees, featuring additional branches, can be used to increase accuracy. In addition, a different number of coefficients can be used as inputs to the decision tree (e.g., $x_0$, $x_1$, $x_2$), which will alter the number of branches and thresholds used. Additionally, the nature of the decision tree will depend upon whether the coefficients are of a polynomial that relates the voice coil voltage measurements to the voice coil current or relate the voice coil current measurements to the voice coil voltage.

Further, it should be understood that, in addition to the values representative of the relationship between voice coil voltage and voice coil current discussed above, other suitable values can be used to estimate the offset of the voice coil. For example, it is conceived that the impedance of the voice coil can be represented as a complex value comprising a resistive and reactive part. The resistive and reactive parts, like the example of FIGS. 6B-6D can be compared to thresholds, e.g., in a decision tree, to estimate whether the voice coil offset is greater than the predetermined distance or the voice coil temperature is greater than a predetermined value.

In yet another example, steps 604 and 606 can be implemented with a neural network trained to detect a relationship between the voice coil voltage and the voice coil current and to determine when a value representative of this relationship indicates that the voice coil offset or temperature exceeds a predetermined threshold. For example, such a neural network can be trained with a historical set of data of voice coil voltage and voice coil current and the associated offsets/temperatures of the voice coil. From this data, the neural network can characterize a mathematical relationship between the voice coil voltage and the voice coil current and identify when some value of this relationship indicates that the offset or temperature has exceeded some predetermined threshold.

Additionally, the above examples estimate offset or temperature according to the values representative of impedance but do not include the additional step of determining the actual offset distance. In other words, the above examples determine when the values representative of the relationship between voice coil voltage and voice coil current indicate that the offset is greater than the predetermined distance or the temperature exceeds a predetermined value, but do not actually calculate what the distance or temperature is. Alternatively, these examples can be modified to calculate the offset displacement or the temperature from the values representative of the relationship between voice coil voltage and voice coil current and to compare the calculated offset or temperature to the predetermined distance or value to determine whether it exceeds it. Generally, though, because this step is not required, it can be excluded in favor of the more economical approaches described above.

In response to determining that the value(s) representative of the relationship between voice coil voltage and voice coil current is indicative of an offset greater than the predetermined distance or a temperature greater than a predetermined value, a magnitude of the drive signal can be reduced to avoid damaging the speaker. This can be implemented by a reduction of an gain of amplifier; however, other methods for reducing the magnitude of the drive signal, such as the inclusion of some variable attenuator that can selectively attenuate the output of the amplifier, can be employed.

Further, the amount of reduction to the magnitude of the drive signal can be related to the value(s) representative of the relationship between voice coil voltage and voice coil current. In other words, increasing reductions to the drive signal magnitude of the drive signal can be effected as the offset or temperature increases. This can be accomplished by implementing multiple thresholds in the above examples, each of which correspond to a different magnitude reduction of the drive signal. Thus, the example described in connection with FIG. 4A can be modified to compare the ratio Z to multiple thresholds, each successively greater threshold corresponding to a successively greater magnitude reduction of the drive signal, such that if the ratio Z exceeds the greatest threshold, the greater magnitude reduction is effected. Likewise, the example described in connection with FIG. 4B can be modified to compare the scaled ratio Z to multiple thresholds that correspond to increasingly greater magnitude reductions. And similarly, the decision of example of FIGS. 4C-5 can be modified to determine how large magnitude reduction to effect according to the determined polynomial coefficients.

At step 608, if the above steps determine that the value(s) representative of the relationship between the voice coil voltage and the voice coil current is indicative of an offset greater than the predetermined distance or a temperature greater than a predetermined value, a magnitude of the drive signal can be reduced to avoid damaging the speaker. This can be implemented by a reduction of the gain of an amplifier; however, other methods for reducing the magnitude of the drive signal, such as the inclusion of some variable attenuator that can selectively attenuate the output of amplifier, can be employed.

Further, the amount of reduction to the magnitude of the drive signal can be related to the value(s) representative of the relationship between the voice coil voltage and the voice coil current. In other words, increasing reductions to the drive signal magnitude of the drive signal can be effected as the offset or temperature increases. This can be accomplished by implementing multiple thresholds in the above examples, each of which correspond to a different magnitude reduction of the drive signal. Thus, the example described in connection with FIG. 6B can be modified to compare the ratio to multiple thresholds, each successively greater threshold corresponding to a successively greater magnitude reduction of the drive signal, such that if the ratio exceeds the greatest threshold, the greater magnitude reduction is effected. Likewise, the example described in connection with FIG. 6C can be modified to compare the scaled ratio to multiple thresholds that correspond to increasingly greater magnitude reductions. And similarly, the decision trees of example of FIGS. 6C-D can be modified to determine how large a magnitude reduction to effect according to the determined impedance magnitude and phase or polynomial coefficients.

In an alternative example, the offset can be detected using only a test signal (i.e., the drive signal does not comprise an additional program content signal). In this example, rather than reducing a magnitude of the drive signal, the maximum potential output to the speaker can be limited until the offset is resolved. Thus, for example, if an offset is detected, the maximum gain provided to speaker can be governed to within a predetermined limit so that a user, turning on a source of program content, will be limited in the maximum volume that the speaker will produce.

In addition, the magnitude of the test signal can be dependent upon the magnitude of the program content signal. Accordingly, a higher magnitude test signal can be introduced as the magnitude of the program content signal increases. Likewise, the values of the thresholds employed in the various examples can depend upon the magnitude of the test signal used, since a larger test signal will tend to induce a larger voice coil voltage and voice coil current.

The mathematical equations provided in this disclosure are simplified for the purposes of illustrating the principles of the inventive aspects only and should not be deemed exclusive or limiting in any way. Furthermore, variations in the mathematical equations are contemplated and are within the spirit and scope of this disclosure.

Regarding the use of symbols herein, a capital letter, e.g., H, generally represents a term, signal, or quantity in the frequency or spectral domain, and a lowercase letter, e.g., h, generally represents a term, signal, or quantity in the time domain. Relation between time and frequency domain is generally well known, and is described at least under the realm of Fourier mathematics or analysis, and is accordingly not presented herein. Additionally, signals, transfer functions, or other terms or quantities represented by symbols herein may be operated, considered, or analyzed in analog or discrete form. In the case of time domain terms or quantities, the analog time index, e.g., t, and/or discrete sample index, e.g., n, may be interchanged or omitted in various cases. Likewise, in the frequency domain, analog frequency indexes, e.g, f, and discrete frequency indexes, e.g., k, are omitted in most cases. Further, relationships and calculations disclosed herein may generally exist or be carried out in either time or frequency domains, and either analog or discrete domains, as will be understood by one of skill in the art. Accordingly, various examples to illustrate every possible variation in time or frequency domains, and analog or discrete domains, are not presented herein.

The functionality described herein, or portions thereof, and its various modifications (hereinafter "the functions") can be implemented, at least in part, via computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of determining whether the offset or temperature exceeds a predetermined threshold and for reducing the magnitude of the drive signal. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

What is claimed is:

1. A method for determining a displacement offset of a voice coil of a speaker, comprising:
    providing a drive signal comprised of a program content signal and a test signal to the voice coil of the speaker;
    determining at least one value representative of a relationship between a voice coil voltage and a voice coil current, wherein the voice coil voltage and the voice coil current result from, at least, the test signal;
    determining whether the at least one value indicates that an offset displacement of the voice coil exceeds a predetermined offset distance; and
    reducing a magnitude of the drive signal provided to the voice coil if the at least one value indicates that the offset displacement of the voice coil exceeds the predetermined offset distance.

2. The method of claim 1, wherein the at least one value is a plurality of coefficients of a polynomial that relates the voice coil voltage and the voice coil current.

3. The method of claim 2, wherein the plurality of coefficients are determined according to an adaptive filter.

4. The method of claim 2, wherein the at least one value indicates that the offset displacement of the voice coil exceeds the predetermined offset distance if, at least, one of the plurality of coefficients exceeds a coefficient threshold.

5. The method of claim 1, wherein the at least one value is a ratio of the voice coil voltage and the voice coil current.

6. The method of claim 1, wherein the at least one value is a magnitude and phase of an impedance of the voice coil.

7. The method of claim 6, wherein the magnitude and phase are determined with a phase-lock loop.

8. The method of claim 6, wherein the magnitude and phase are determined with a lock-in amplifier.

9. The method of claim 1, wherein a magnitude of the test signal is related to a magnitude or to an average magnitude of at least one program content signal provided to the voice coil.

10. The method of claim 1, further comprising the steps of:
    determining whether the at least one value indicates that a temperature of the voice coil has exceeded a predetermined temperature threshold; and
    reducing a magnitude of a drive signal provided to the voice coil if the at least one value indicates that the temperature of the voice has exceeded the predetermined temperature threshold.

11. A non-transitory storage medium storing program code that, when executed by a processor, performs a method comprising the steps of:
    determining at least one value representative of a relationship between a voice coil voltage and a voice coil current, wherein the voice coil voltage and the voice coil current result from, at least, a test signal applied to a voice coil of a speaker;
    determining whether the at least one value indicates that an offset displacement of the voice coil exceeds a predetermined offset distance; and
    reducing a magnitude of a drive signal provided to the voice coil if the at least one value indicates that the offset displacement of the voice coil exceeds the predetermined offset distance, wherein the drive signal includes the test signal.

12. The non-transitory storage medium of claim 11, wherein the at least one value is a plurality of coefficients of a polynomial that relates the voice coil voltage and the voice coil current.

13. The non-transitory storage medium of claim 12, wherein the plurality of coefficients are determined according to an adaptive filter.

14. The non-transitory storage medium of claim 12, wherein the at least one value indicates that the offset displacement of the voice coil exceeds the predetermined offset distance if, at least, one of the plurality of coefficients exceeds a coefficient threshold.

15. The non-transitory storage medium of claim 11, wherein the at least one value is a ratio of the voice coil voltage and the voice coil current.

16. The non-transitory storage medium of claim 11, wherein the at least one value is a magnitude and phase of an impedance of the voice coil.

17. The non-transitory storage medium of claim 16, wherein the magnitude and phase are determined with a phase-lock loop.

18. The non-transitory storage medium of claim 16, wherein the magnitude and phase are determined with a lock-in amplifier.

19. The non-transitory storage medium of claim 11, wherein a magnitude of the test signal is related to a magnitude or to an average magnitude of at least one program content signal provided to the voice coil.

20. The non-transitory storage medium of claim 11, the method executed by the processor further comprising the steps of:
    determining whether the at least one value indicates that a temperature of the voice coil has exceeded a predetermined temperature threshold; and
    reducing a magnitude of a drive signal provided to the voice coil if the at least one value indicates that the temperature of the voice has exceeded the predetermined temperature threshold.

\* \* \* \* \*